(12) United States Patent
Masuda et al.

(10) Patent No.: US 10,230,366 B2
(45) Date of Patent: Mar. 12, 2019

(54) CURRENT CONTROL DEVICE AND POWER SUPPLY SYSTEM

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventors: Kazuki Masuda, Mie (JP); Byeongsu Jeong, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 15/552,400

(22) PCT Filed: Feb. 5, 2016

(86) PCT No.: PCT/JP2016/053473
§ 371 (c)(1),
(2) Date: Aug. 21, 2017

(87) PCT Pub. No.: WO2016/136426
PCT Pub. Date: Sep. 1, 2016

(65) Prior Publication Data
US 2018/0041206 A1 Feb. 8, 2018

(30) Foreign Application Priority Data
Feb. 24, 2015 (JP) ................................. 2015-034030

(51) Int. Cl.
*H03K 17/74* (2006.01)
*H03K 17/687* (2006.01)
(Continued)

(52) U.S. Cl.
CPC ....... *H03K 17/687* (2013.01); *H03K 17/0822* (2013.01); *H03K 17/08122* (2013.01); *H03K 17/16* (2013.01); *H03K 2217/0054* (2013.01)

(58) Field of Classification Search
None
See application file for complete search history.

(56) References Cited

U.S. PATENT DOCUMENTS 9,729,140 B2 * 8/2017 Close ..................... H03K 17/56
9,979,294 B1 * 5/2018 Harriman ............ H02M 3/1588
(Continued)

FOREIGN PATENT DOCUMENTS

JP 2003-164039 A 6/2003
JP 2003-179316 A 6/2003
(Continued)

OTHER PUBLICATIONS

Search Report for PCT/JP2016/053473, dated Apr. 26, 2016.

*Primary Examiner* — Lincoln Donovan
*Assistant Examiner* — Khareem E Almo
(74) *Attorney, Agent, or Firm* — Honigman LLP (57) ABSTRACT

A control portion and semiconductor switches included in a power supply system function as a current control device. The source of the semiconductor switch is connected to the source of the semiconductor switch. The two semiconductor switches connect the respective positive electrodes of a first power storage element and a second power storage element to each other. The control portion controls a current flowing between the drains of the two semiconductor switches by substantially simultaneously turning on or off the two semiconductor switches. The respective breakdown voltages between the drain and the source of the two semiconductor switches are different from each other.

2 Claims, 5 Drawing Sheets

(51) Int. Cl.
*H03K 17/082* (2006.01)
*H03K 17/16* (2006.01)
*H03K 17/0812* (2006.01)

(56) References Cited

U.S. PATENT DOCUMENTS

| | | |
|---|---|---|
| 2003/0137813 A1 | 7/2003 | Onizuka et al. |
| 2010/0246139 A1 | 9/2010 | Suzuki et al. |
| 2012/0187982 A1* | 7/2012 | Kurokawa ....... H03K 19/01852 327/108 |
| 2013/0265029 A1* | 10/2013 | Akiyama ............... H03K 17/94 323/311 |
| 2015/0256170 A1* | 9/2015 | Close .................... H03K 17/56 327/482 |
| 2016/0036431 A1* | 2/2016 | Roig-Guitart ........ H03K 17/102 323/271 |
| 2017/0093402 A1* | 3/2017 | Yamada ................ H03K 19/20 |
| 2017/0222641 A1* | 8/2017 | Zou ..................... B60L 11/1803 |
| 2017/0264284 A1* | 9/2017 | Xu ...................... B60L 11/1803 |
| 2018/0167013 A1* | 6/2018 | Xu ...................... B60L 11/1803 |

FOREIGN PATENT DOCUMENTS

| | | |
|---|---|---|
| JP | 2005-151624 A | 6/2005 |
| JP | 2010-232318 A | 10/2010 |

* cited by examiner

CURRENT CONTROL DEVICE AND POWER SUPPLY SYSTEM

CROSS-REFERENCE TO RELATED APPLICATIONS

This application is the U.S. national stage of PCT/JP2016/053473 filed Feb. 5, 2016, which claims priority of Japanese Patent Application No. JP 2015-034030 filed Feb. 24, 2015.

TECHNICAL FIELD

The present invention relates to a current control device that substantially simultaneously turns on or off two semiconductor switches whose one ends are connected to each other, thereby controlling a current flowing between the other ends of the two semiconductor switches, and a power supply system including the current control device.

BACKGROUND

A power supply system in which a battery feeds power to a load is installed in a vehicle. Power supply systems in which a battery feeds power to a load include a power supply system including two semiconductor switches whose respective one ends are connected to each other. In such power supply systems, the other end of one of the semiconductor switches is connected to the positive electrode of the battery, and the other end of the other semiconductor switch is connected to one end of the load. Then, the current flowing from the battery to the load is controlled by substantially simultaneously turning on or off the two semiconductor switches.

JP 2014-49686A discloses a current control device that substantially simultaneously turns on or off two semiconductor switches whose respective one ends are connected to each other, thereby controlling the current flowing between the respective other ends of the two semiconductor switches. The current control device described in JP 2014-49686A includes two N-channel FETs (Field Effect Transistors), and each of the two FETs functions as a semiconductor switch.

For the two FETS, the source of one FET is connected to the source of the other FET. A common voltage is applied to the respective gates of the two FETs. The two FETs are substantially simultaneously turned off or on by adjusting the voltage applied to the respective gates of the two FETs. Consequently, the current flowing through the respective drains of the two FETs is controlled.

When a current flows through two semiconductor switches, heat is generated from each of the two semiconductor switches. The amount of heat generated from a current control device including two semiconductor switches whose one ends are connected to each other increases with an increase in the resistance between the other ends of the two semiconductor switches, or in other words, the combined resistance of the on resistances of the two semiconductor switches, and increases with an increase in the value of the current flowing via the two semiconductor switches. When a large amount of heat is generated between the two semiconductor switches, there is the possibility that a short circuit may occur between the other ends of the two semiconductor switches.

Today, a large number of loads that are powered by a battery are installed in a vehicle, so that it is necessary to supply a large current to the large number of loads via the two semiconductor switches. Therefore, as a current control device that controls a current by substantially simultaneously turning on or off the two semiconductor switches, there is a need for a current control device that generates less heat even when a large current flow through the two semiconductor switches.

As a current control device that generates less heat, it is conceivable to use a current control device including two semiconductor switches having small on resistances.

However, for semiconductor switches having the same breakdown voltage thereacross, a semiconductor switch having a small on resistance is generally small. Therefore, a current control device including two semiconductor switches having the same breakdown voltage thereacross and having a small on resistance is large, and thus is not suitable as a current control device installed in a vehicle, which has a limited space.

Furthermore, since large semiconductor switches are expensive, a current control device including two semiconductor switches having a small on resistance also has the problem of an increased manufacturing cost.

The present invention has been made in view of such circumstances, and it is an object of the invention to provide a compact current control device that generates less heat and can be manufactured inexpensively, and a power supply system including the current control device.

SUMMARY

A current control device according to an aspect of the present invention includes a switch control portion that substantially simultaneously turns on or off two semiconductor switches whose one ends are connected to each other, a current flowing between other ends of the two semiconductor switches being controlled by the switch control portion turning on or off the two semiconductor switches, wherein respective breakdown voltages across the two semiconductor switches are different from each other, and the two semiconductor switches connect respective one ends of two power storage elements to each other.

According to this aspect of the present invention, respective one ends of two semiconductor switches are connected to each other. One end of a power storage element is connected to the other end of one of the two semiconductor switches, and one end of another power storage element is connected to the other end of the other one of the two semiconductor switches. When the semiconductor switches are FETs, the source of one semiconductor switch is connected to the source of the other semiconductor switch, for example. A current flowing via the two semiconductor switches is controlled by substantially simultaneously turning on or off the two semiconductor switches.

The respective breakdown voltages across the two semiconductor switches are different. In general, the on resistance of a semiconductor switch increases with an increase in the breakdown voltage. Therefore, since the breakdown voltages across the two semiconductor switches are different, the combined resistance of the on resistances of the two semiconductor switches is small. Consequently, less heat is generated when a current flows via the respective other ends of the two semiconductor switches. Furthermore, a semiconductor switch having a low breakdown voltage thereacross is small and inexpensive. Accordingly, the device is small, and can be manufactured inexpensively.

A current control device according to an aspect of the present invention includes one or more second semiconductor switches connected in parallel with one of the two semiconductor switches, wherein each of the one or more second semiconductor switches has substantially the same breakdown voltage as the semiconductor switch with which the second semiconductor switch is connected in parallel, and the switch control portion substantially simultaneously turns on or off the two semiconductor switches and the one or more second semiconductor switches.

According to this aspect of the present invention, one or more second semiconductor switches are connected in parallel with one of the two semiconductor switches. The breakdown voltages across the semiconductor switch and the second semiconductor switch that are connected in parallel are substantially the same. A current flowing between the other ends of the two semiconductor switches is controlled by substantially simultaneously turning on or off the two semiconductor switches and the one or more second semiconductor switches.

When a second semiconductor switch is connected in parallel with a semiconductor switch, the resistance across the semiconductor switch, or in other words, the combined resistance of the respective on resistances of the semiconductor switch and the second semiconductor switch is smaller than the on resistance of the semiconductor switch. Furthermore, the resistance across the semiconductor switch decreases with an increase in the number of the second semiconductor switches connected in parallel thereto. Of course, when the resistance across the semiconductor switch is small, the resistance between the other ends of the two semiconductor switches is also small. Accordingly, when the two semiconductor switches and the one or more second semiconductor switches are on, the resistance between the respective other ends of the two semiconductor switches is smaller, and the device generates further less heat.

In a current control device according to an aspect of the present invention, the number of the second semiconductor switches connected in parallel with one of the two semiconductor switches is different from the number of the second semiconductor switches connected in parallel with the other semiconductor switch.

According to this aspect of the present invention, for example, the number of the second semiconductor switches that is larger than the number of the second semiconductor switches connected in parallel with the semiconductor switch having a higher breakdown voltage thereacross of the two semiconductor switches is connected in parallel with the semiconductor switch having a lower breakdown voltage thereacross. Normally, a semiconductor switch having a high breakdown voltage thereacross has a great on resistance. The amount of decrease in resistance when the second semiconductor switch is connected in parallel with the semiconductor switch having the higher on resistance is greater than the amount of decrease in resistance when the second semiconductor switch is connected in parallel with the semiconductor switch having a lower on resistance. Therefore, when a larger number of the second semiconductor switches are connected in parallel with the semiconductor switch having a higher breakdown voltage thereacross, it is possible to achieve a device in which the resistance between the respective other ends of the two semiconductor switches in a state where the two semiconductor switches and one or more semiconductor switches are on is significantly small.

For example, the number of second semiconductor switches that is larger than the number of the second semiconductor switches connected in parallel with the semiconductor switch having a higher breakdown voltage thereacross of the two semiconductor switches is connected in parallel with the semiconductor switch having a lower breakdown voltage thereacross. In general, a semiconductor switch having a low breakdown voltage thereacross is inexpensive. Therefore, when a larger number of second semiconductor switches are connected in parallel with a semiconductor switch having a low breakdown voltage thereacross, it is possible to inexpensively achieve a device in which the resistance between the respective other ends of the two semiconductor switches when the two semiconductor switches or one or more semiconductor switches are on is further smaller.

A power supply system according to an aspect of the present invention includes: the above-described current control device; the two power storage elements; and a load that is powered by the two power storage elements, wherein voltages that are different from each other are applied to the two power storage elements.

According to this aspect of the present invention, the load is powered by a power storage element whose one end is connected to the other end of one of the two semiconductor switches, and another power storage element whose one end is connected to the other end of the other of the two semiconductor switches. The current flowing between the other ends of the two semiconductor switches is controlled by substantially simultaneously turning on or off the two semiconductor switches. The voltages respectively applied to the two power storage elements when power storage is performed are different, and the respective breakdown voltages across the two semiconductor switches are values corresponding to the voltages respectively applied to the two power storage elements.

Advantageous Effects of Invention

According to the present invention, it is possible to achieve a small current control device that generates less heat and can be manufactured inexpensively. Furthermore, it is also possible to achieve a power supply system including the current control device.

DETAILED DESCRIPTION OF PREFERRED EMBODIMENTS

Hereinafter, the present invention will be described on the basis of drawings showing embodiments thereof.

Embodiment 1

Figure 1:
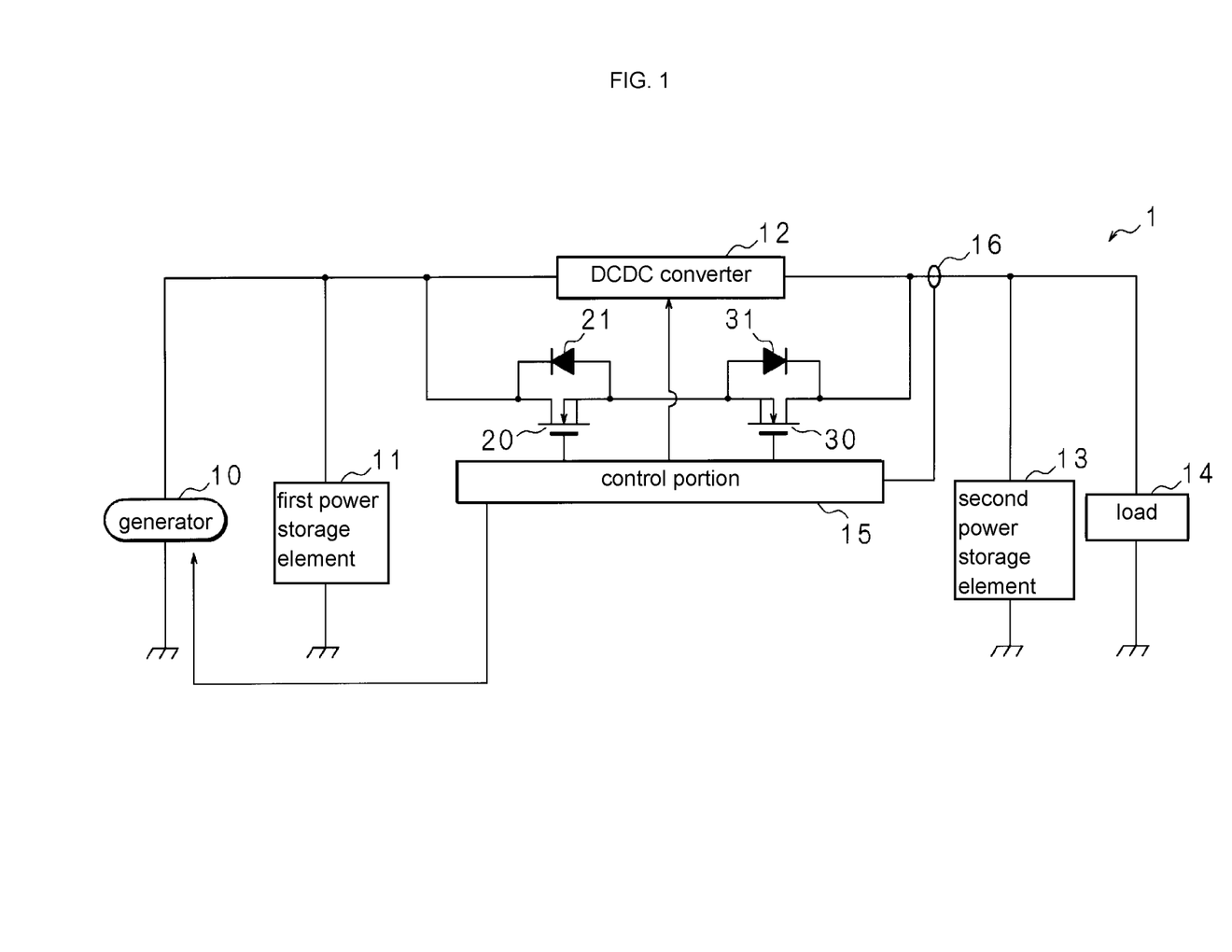
FIG. 1 is a block diagram showing the configuration of a relevant portion of a power supply system according to Embodiment 1.

FIG. 1 is a block diagram showing the configuration of a relevant portion of a power supply system 1 according to Embodiment 1. The power supply system 1 is suitably installed in a vehicle, and includes a generator 10, a first power storage element 11, a DCDC converter 12, a second power storage element 13, a load 14, a control portion 15, a current sensor 16, and two semiconductor switches 20 and 30.

Each of the two semiconductor switches 20 and 30 is an N-channel FET (Field Effect Transistor). Diodes 21 and 31 are parasitic diodes of the semiconductor switches 20 and 30, respectively. The cathode of the diode 21 is connected to the drain of the semiconductor switch 20, and its anode is connected to the source of the semiconductor switch 20. The cathode of the diode 31 is connected to the drain of the semiconductor switch 30, and its anode is connected to the source of the semiconductor switch 30.

The source of the semiconductor switch 20 is connected to the source of the semiconductor switch 30. Respective one ends of the generator 10 and the DCDC converter 12 and the positive electrode of the first power storage element 11 are connected to the drain of the semiconductor switch 20. The other end of the DCDC converter 12, the positive electrode of the second power storage element 13, and one end of the load 14 are connected to the drain of the semiconductor switch 30. In this manner, the two semiconductor switches 20 and 30 connect the respective positive electrodes of the first power storage element 11 and the second power storage element 13. The respective other ends of the generator 10 and the load 14 and the respective negative electrodes of the first power storage element 11 and the second power storage element 13 are grounded. The gates of the semiconductor switches 20 and 30 are separately connected to the control portion 15. The control portion 15 is further connected to the current sensor 16.

A current can flow between the drain and the source of each of the semiconductor switches 20 and 30, if the voltage applied to their gates from the control portion 15 is greater than or equal to a predetermined voltage. No current will flow between the drain and the source if the voltage applied to the gate from the control portion 15 is less than the predetermined voltage.

Therefore, each of the semiconductor switches 20 and 30 is on if the voltage applied to the gate is greater than or equal to the predetermined voltage, and is off if the voltage applied to the gate is less than the predetermined voltage.

The generator 10 generates AC power in conjunction with an engine (not shown) installed on the vehicle. The generator 10 rectifies the generated AC power into DC power, and outputs a DC voltage related to the rectified DC power to one end of the DCDC converter 12 as an output voltage. Further, the generator 10 applies the output voltage to the first power storage element 11.

A lowering instruction to instruct to the generator 10 to lower the output voltage is input to the generator 10 from the control portion 15. When the lowering instruction is input, the generator 10 outputs an output voltage that is lower than the output voltage that is normally output. In the following, the output voltage that is normally output by the generator 10 is referred to as "normal voltage", and the output voltage that is temporarily output by the generator 10 when the lowering instruction has been input into it is referred to as "temporary voltage". Each of the normal voltage and the temporary voltage is constant.

A cancellation instruction to instruct the generator 10 to cancel the lowering of the output voltage is further input to the generator 10 from the control portion 15. When the cancellation instruction is input, the generator 10 returns the output voltage from the temporary voltage to the normal voltage.

The first power storage element 11 is a capacitor, for example. When the output voltage of the generator 10 is applied to the first power storage element 11, the first power storage element 11 stores power. When the generator 10 is not generating power, the first power storage element 11 outputs the output voltage to one end of the DCDC converter 12.

The DCDC converter 12 transforms the output voltage that is output by the generator 10 or the first power storage element 11. The transformed voltage transformed by the DCDC converter 12 is applied from the DCDC converter 12 to the second power storage element 13 and the load 14.

A start instruction to instruct the DCDC converter 12 to start the transformation, and a deactivation instruction to instruct the DCDC converter 12 to stop the transformation is input to the DCDC converter 12 from the control portion 15. When the start instruction is input from the control portion 15, the DCDC converter 12 starts the above-described transformation. When the deactivation instruction is input, the DCDC converter 12 stops the transformation. The current flowing through the DCDC converter 12 is limited.

The second power storage element 13 is a lead-acid battery, for example. The load 14 is an electric device installed on the vehicle.

When the two semiconductor switches 20 and 30 are off and the DCDC converter 12 is performing the transformation, the transformed voltage is applied to each of the second power storage element 13 and the load 14 from the DCDC converter 12. Consequently, the second power storage element 13 stores power, and the load 14 is powered.

When the generator 10 is generating power in the case where the two semiconductor switches 20 and 30 are on and the DCDC converter 12 stops the transformation, the generator 10 applies the output voltage to the second power storage element 13 and the load 14 via the two semiconductor switches 20 and 30. When the generator 10 is not generating power in this case, the first power storage element 13 applies the output voltage to the second power storage element 13 and the load 14 via the two semiconductor switches 20 and 30. By application of the output voltage that is output by the generator 10 or the first power storage element 11, the second power storage element 13 stores power, and the load 14 is powered.

If the two semiconductor switches 20 and 30 are off and the DCDC converter 12 stops the transformation, the second power storage element 13 applies the output voltage to the load 14. Consequently, the load 14 is powered.

The current sensor 16 detects the output current that is output from the other end of the DCDC converter 12 or the drain of the semiconductor switch 30, and outputs current information indicating the magnitude of the detected current to the control portion 15.

The control portion 15 includes a CPU (Central Processing Unit), and executes processing by executing control programs stored in a ROM (Read Only Memory), which is not shown. On the basis of the magnitude of the current indicated by the current information input from the current sensor 16, the control portion 15 controls adjustment of the output voltage of the generator 10, activation and deactivation of the DCDC converter 12, and turning on and off of the semiconductor switches 20 and 30.

The control portion 15 adjusts the output voltage of the generator 10 to the normal voltage or the temporary voltage by outputting the lowering instruction and the cancellation instruction to the generator 10. The control portion 15 controls activation and deactivation of the DCDC converter 12 by outputting the start instruction and the deactivation instruction to the DCDC converter 12. Furthermore, the control portion 15 controls turning on and off of each of the semiconductor switches 20 and 30 by adjusting the voltage applied to the gate of each of the semiconductor switches 20 and 30.

When the engine is being activated, the control portion 15 normally adjusts the output voltage of the generator 10 to the normal voltage, and causes the DCDC converter 12 to perform the transformation and turns the two semiconductor switches 20 and 30 off. The state of the power supply system 1 at this time is hereinafter referred to as "normal state".

When the power supply system 1 is in the normal state, the generator 10 outputs the normal voltage, and the transformed voltage is applied from the DCDC converter 12 to the second power storage element 13 and the load 14. In this case, the first power storage element 11 stores power as a result of the normal voltage being applied to the generator 10 from the first power storage element 11, and the second power storage element 13 stores power as a result of the transformed voltage being applied to the second power storage element 13 from the DCDC converter 12. The normal voltage is different from the transformed voltage. Specifically, the normal voltage is higher than the transformed voltage. The normal voltage is, for example, 24 volts, and the transformed voltage is for, example, 12 volts.

When the power supply system 1 is in the normal state, a current is output from the other end of the DCDC converter 12. When the power supply system 1 is in the normal state, the control portion 15 determines whether the output current of the DCDC converter 12 is greater than or equal to an upper limit current, on the basis of the magnitude of the current indicated by the current information input from the current sensor 16.

The upper limit current is less than or equal to a maximum current that can flow through the DCDC converter 12.

If it is determined that the output current of the DCDC converter 12 is greater than or equal to the upper limit current when the power supply system 1 is in the normal state, the control portion 15 lowers the output voltage of the generator 10 from the normal voltage to the temporary voltage to cause the DCDC converter 12 to stop the transformation, and simultaneously or substantially simultaneously turns on the two semiconductor switches 20 and 30. The state of the power supply system 1 at this time is hereinafter referred to as "direct powering state".

When the power supply system 1 is in the direct powering state, each of the second power storage element 13 and the load 14 is directly powered by the generator 10 or the first power storage element 13 via the drain of each of the two semiconductor switches 20 and 30. Specifically, when the generator 10 is generating power, the temporary voltage is applied from the generator 10 to the second power storage element 13 and the load 14. Consequently, the second power storage element 13 stores power, and the load 14 is powered. When the generator 10 is not generating power, the output voltage is supplied from the first power storage element 13 to the second power storage element 13 and the load 14. Consequently, the second power storage element 13 stores power, and the load 14 is powered.

When the power supply system 1 is in the direct powering state, a current exceeding the above-described maximum current can be supplied from the generator 10 or the first power storage element 13 to the load 14.

As described thus far, if the output current of the DCDC converter 12 is greater than or equal to the upper limit current when the power supply system 1 is in the normal state, the power supply system 1 is switched from the normal state to the direct powering state to keep supplying power to the load 14. Accordingly, it is possible to keep supplying power to the load 14 even when the load 14 needs the supply of a current larger than the maximum current that can flow via the DCDC converter 12.

When the power supply system 1 is in the direct powering state, a current is output from the drain of the semiconductor switch 30. When the power supply system 1 is in the direct powering state, the control portion 15 determines whether the output current that is output from the drain of the semiconductor switch 30 is less than a lower limit current, on the basis of the magnitude of the current indicated by the current information input from the current sensor 16. The lower limit current is less than or equal to the upper limit current. For example, the upper limit current is 100 A, and the lower limit current is 90 A.

If it is determined that the output current that is output from the drain of the semiconductor switch 30 is less than the lower limit current when the power supply system 1 is in the direct powering state, the control portion 15 simultaneously or substantially simultaneously turns off the two semiconductor switches 20 and 30 to cause the DCDC converter 12 to start the transformation, thus returning the output voltage of the generator 10 from the temporary voltage to the normal voltage. Consequently, the power supply system 1 returns to the normal state.

The control portion 15 functions as a switch control portion.

When the engine is deactivated, the generator 10 will not generate power. When the engine is deactivated, the control portion 15 causes the DCDC converter 12 to stop the transformation and turns off the two semiconductor switches 20 and 30. Accordingly, when the engine is deactivated, power is supplied from the second power storage element 13 to the load 14, and no power will be supplied from the generator 10 and the first power storage element 11.

As described thus far, the control portion 15 controls the current flowing between the drains of the two semiconductor switches 20 and 30 by simultaneously or substantially simultaneously turning on or off the two semiconductor switches 20 and 30. The control portion 15 and the two semiconductor switches 20 and 30 function as a current control device.

As described previously, the source of the semiconductor switch 20 is connected to the source of the semiconductor switch 30. Accordingly, the anode of the diode 21 is connected to the anode of the diode 31. Therefore, no current will flow between the drains of the semiconductor switches 20 and 30 when the two semiconductor switches 20 and 30 are off.

Figure 2:
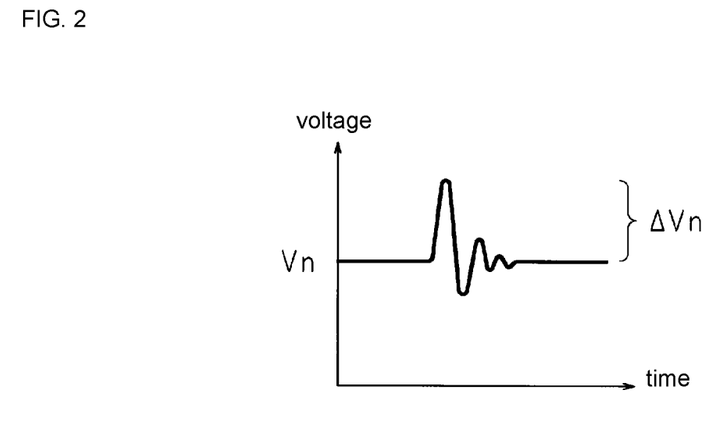
FIG. 2 shows a voltage waveform illustrating an example of voltage fluctuations at a drain of a semiconductor switch.

FIG. 2 is a voltage waveform illustrating an example of voltage fluctuations at the drain of the semiconductor switch 20. The voltage waveform of FIG. 2 shows voltage fluctuations occurring at the drain of the semiconductor switch 20 when external noise is applied to a normal voltage Vn in the case where the voltage across the first power storage element 11 is the normal voltage Vn. As shown in FIG. 2, when external noise is applied to the normal voltage Vn in the case where the voltage across the first power storage element 11 is the normal voltage Vn, the voltage generated at the drain of the semiconductor switch 20 is rapidly increased by ΔVn. Thereafter, the voltage across the first power storage element 11 returns to the normal voltage Vn.

The voltage (Vn+ΔVn) is a maximum value of the voltage at the drain of the semiconductor switch 20. Therefore, the breakdown voltage between the drain and the source of the semiconductor switch 20 should be greater than or equal to (Vn+ΔVn).

When external noise is applied to the normal voltage Vn in the case where the power supply system 1 is in the normal state, the voltage at the drain of the semiconductor switch 20 may be a voltage (Vn+ΔVn).

When external noise is applied to a transformed voltage Vc in a case where the voltage across the second power storage element 13 is the transformed voltage Vc, the voltage at the drain of the semiconductor switch 30 fluctuates in the same manner as in the case of the voltage at the drain of the semiconductor switch 20, and is rapidly increased by ΔVc. Thereafter, the voltage across the second power storage element 13 returns to the transformed voltage Vc.

The voltage (Vc+ΔVc) is a maximum value of the voltage at the drain of the semiconductor switch 30. Therefore, the breakdown voltage between the drain and the source of the semiconductor switch 30 should be greater than or equal to (Vc+ΔVc).

When external noise is applied to the transformed voltage Vc in the case where the power supply system 1 is in the normal state, the voltage at the drain of the semiconductor switch 30 may be a voltage (Vc+ΔVc).

As described previously, the transformed voltage Vc is less than the normal voltage Vn. Therefore, the voltage (Vc+ΔVc) is less than the voltage (Vn+ΔVn). Since the voltage (Vc+ΔVc) is less than the voltage (Vn+ΔVn), the power supply system 1 uses, as the semiconductor switch 30, a semiconductor switch in which the breakdown voltage between the drain and the source is lower than the breakdown voltage between the drain and the source of the semiconductor switch 20.

For example, the voltage (Vn+ΔVn) is 48 volts, and the voltage (Vc+ΔVc) is 24 volts. In this case, the power supply system 1 uses, as the semiconductor switch 20, a semiconductor switch in which the breakdown voltage between the drain and the source is 50 volts, for example, and uses, as the semiconductor switch 30, a semiconductor switch in which the breakdown voltage between the drain and the source is 25 volts, for example.

As described thus far, in the power supply system 1, the breakdown voltage between the drain and the source of the semiconductor switch 20 has a value corresponding to the voltage applied to the first power storage element 11, and the breakdown voltage between the drain and the source of the semiconductor switch 30 has a value corresponding to the voltage applied to the second power storage element 13.

In general, the on resistance of a semiconductor switch, in particular, a MOSFET (Metal Oxide Semiconductor Field Effect Transistor) increases with an increase in the breakdown voltage between the drain and the source. The reason for this is that in a semiconductor switch having a high breakdown voltage between the drain and the source, the channel length is ensured to prevent punch-through, and the carrier concentration of the epitaxial layer is reduced in order to prevent reach-through.

As described previously, for the two semiconductor switches 20 and 30, the breakdown voltages between the drain and the source are different. Therefore, the combined resistance of the on resistances of the two semiconductor switches 20 and 30 is smaller than the combined resistance of the on resistances of the two semiconductor switches if the two semiconductor switches in which the breakdown voltage between the drain and the source is (Vn+ΔVn) were used in place of the two semiconductor switches 20 and 30. If the combined resistance of the on resistances of the two semiconductor switches 20 and 30 is small, then the resistance between the other ends of the two semiconductor switches 20 and 30 is small. Therefore, a current control device including the control portion 15 and the two semiconductor switches 20 and 30 generates less heat when a current flows via the respective drains of the two semiconductor switches 20 and 30.

Further, a semiconductor switch in which the breakdown voltage between the drain and the source is low is generally small and inexpensive. The semiconductor switch 30 has a low breakdown voltage between the drain and the source, and thus is small and inexpensive. Therefore, the current control device including the control portion 15 and the two semiconductor switches 20 and 30 is small and can be manufactured inexpensively.

Embodiment 2

In Embodiment 1, the source of the semiconductor switch 20 is connected to the source of the semiconductor switch 30. However, it is also possible that the drain of the semiconductor switch 20 is connected to the drain of the semiconductor switch 30.

In the following, aspects in which Embodiment 2 differs from Embodiment 1 will be described. Structures other than the structures described below are the same as those of Embodiment 1, and thus are denoted by the same reference numerals, with a detailed description thereof being omitted.

Figure 3:
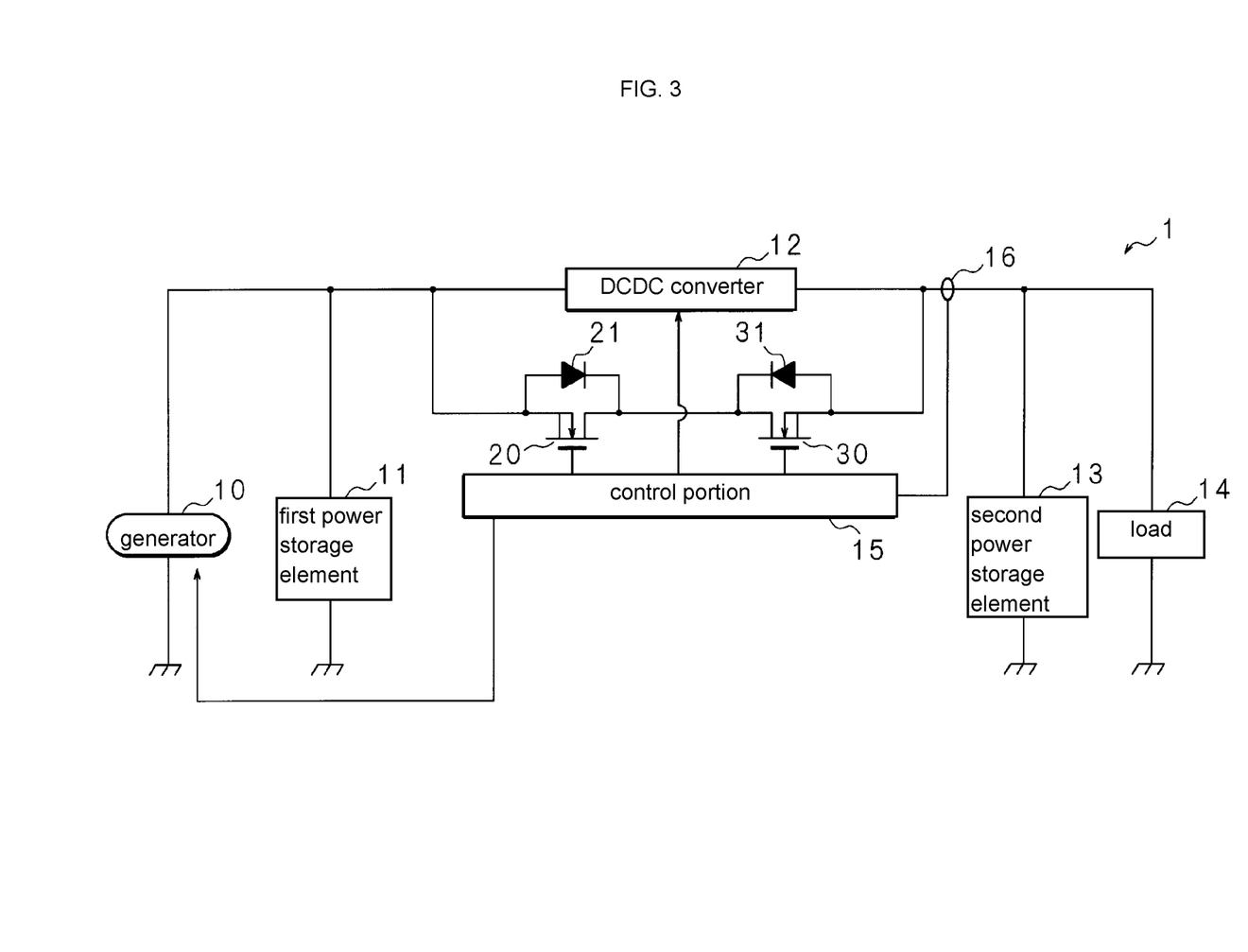
FIG. 3 is a block diagram showing the configuration of a relevant portion of a power supply system according to Embodiment 2.

FIG. 3 is a block diagram showing the configuration of a relevant portion of a power supply system 1 according to Embodiment 2. The power supply system 1 of Embodiment 2 is also suitably installed in a vehicle like the power supply system 1 of Embodiment 1. The power supply system 1 of Embodiment 2 includes all the constituting elements included in the power supply system 1 of Embodiment 1. In Embodiment 2, the generator 10, the first power storage element 11, the DCDC converter 12, the second power storage element 13, the load 14, the control portion 15, and the current sensor 16 are each connected in the same manner as in Embodiment 1.

The drain of the semiconductor switch 20 is connected to the drain of the semiconductor switch 30. One end of each of the generator 10 and the DCDC converter 12, and the positive electrode of the first power storage element 11 are connected to the source of the semiconductor switch 20. The other end of the DCDC converter 12, the positive electrode of the second power storage element 13, and one end of the load 14 are connected to the source of the semiconductor switch 30. In this manner, the two semiconductor switches 20 and 30 connect the respective positive electrodes of the first power storage element 11 and the second power storage element 13. The gates of the semiconductor switches 20 and 30 are separately connected to the control portion 15.

The cathode and the anode of the diode 21 are connected to the drain and the source, respectively, of the semiconductor switch 20. The cathode and the anode of the diode 31 are connected to the drain and the source, respectively, of the semiconductor switch 30. Accordingly, the cathode of the diode 21 is connected to the cathode of the diode 31. Therefore, when the two semiconductor switches 20 and 30 are off, no current will flow between the sources of the semiconductor switches 20 and 30.

The generator 10, the first power storage element 11, the DCDC converter 12, the second power storage element 13, the load 14, the control portion 15, and the current sensor 16 function in the same manner as in Embodiment 1. The functions of these components can be explained by interchanging the drain and the source of the semiconductor switch 20, and interchanging the drain and the source of the semiconductor switch 30 in the description of Embodiment 1. Turning on and off of the semiconductor switches 20 and 30 are performed by the control portion 15 in the same manner as in Embodiment 1.

The voltage (Vn+ΔVn) is a maximum value of the voltage at the source of the semiconductor switch 20. Accordingly, the breakdown voltage between the drain and the source of the semiconductor switch 30 should be greater than or equal to (Vn+ΔVn).

When the power supply system 1 of Embodiment 2 is in the normal state, the voltage (Vn+ΔVn) may be applied between the drain and the source of the semiconductor switch 30.

The voltage (Vc+ΔVc) is a maximum value of the voltage at the source of the semiconductor switch 30. Accordingly, the breakdown voltage between the drain and the source of the semiconductor switch 20 should be greater than or equal to (Vc+ΔVc).

When the power supply system 1 of Embodiment 2 is in the normal state, the voltage (Vc+ΔVc) may be applied between the drain and the source of the semiconductor switch 20.

The transformed voltage Vc is less than the normal voltage Vn. Therefore, the voltage (Vc+ΔVc) is less than the voltage (Vn+ΔVn). Since the voltage (Vc+ΔVc) is less than the voltage (Vn+ΔVn), the power supply system 1 of Embodiment 2 uses, as the semiconductor switch 20, a semiconductor switch in which the breakdown voltage between the drain and the source is lower than the breakdown voltage between the drain and the source of the semiconductor switch 30.

In the power supply system 1 of Embodiment 2, the breakdown voltage between the drain and the source of the semiconductor switch 20 has a value corresponding to the voltage applied to the second power storage element 13, and the breakdown voltage between the drain and the source of the semiconductor switch 30 has a value corresponding to the voltage applied to the first power storage element 11.

As described thus far, the breakdown voltage between the drain and the source differs between the two semiconductor switches 20 and 30 in Embodiment 2 as well. Therefore, the power supply system 1 of Embodiment 2, which includes the control portion 15 and the two semiconductor switches 20 and 30, achieves the same effect as that achieved in Embodiment 1.

Embodiment 3

Since the breakdown voltage between the drain and the source differs between the two semiconductor switches 20 and 30 in the power supply system 1 of Embodiment 1, less heat is generated when a current flows via the respective drains of the two semiconductor switches 20 and 30. The amount of heat generated can be further reduced by connecting semiconductor switches in parallel to each of the semiconductor switches 20 and 30.

In the following, aspects in which Embodiment 3 differs from Embodiment 1 will be described. Structures other than the structures described below are the same as those of Embodiment 1, and thus are denoted by the same reference numerals, with a detailed description thereof being omitted.

Figure 4:
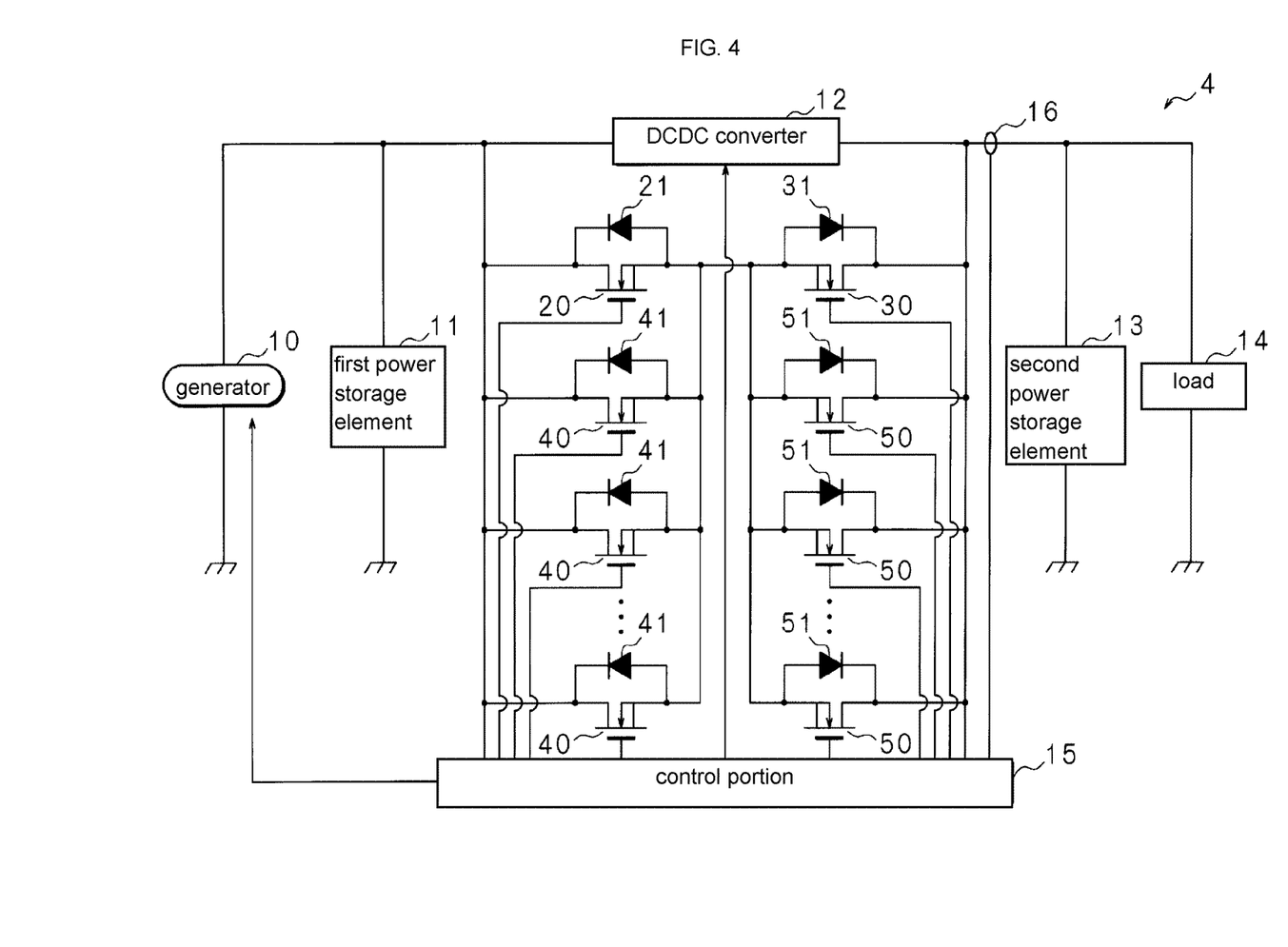
FIG. 4 is a block diagram showing the configuration of a relevant portion of a power supply system according to Embodiment 3.

FIG. 4 is a block diagram showing the configuration of a relevant portion of a power supply system 4 according to Embodiment 3. The power supply system 4 is also suitably installed in a vehicle, like the power supply system 1 of Embodiment 1. Like the power supply system 1, the power supply system 4 includes a generator 10, a first power storage element 11, a DCDC converter 12, a second power storage element 13, a load 14, a control portion 15, a current sensor 16, and two semiconductor switches 20 and 30, which are connected in the same manner as in Embodiment 1.

The power supply system 4 further includes M (M: natural number) semiconductor switches 40, 40, . . . , 40, and N (N: natural number) semiconductor switches 50, 50, . . . 50. The semiconductor switches 40 and 50 are N-channel FETs. In the following, simply referring to "N" means the number of the semiconductor switches 40, rather than N-channel.

A diode 41, which is a parasitic diode, is connected to each of the M semiconductor switches 40, 40, . . . , 40. The cathode of the diode 41 is connected to the drain of the corresponding semiconductor switch 40, and its anode is connected to the source of the semiconductor switch 40.

A diode 51, which is a parasitic diode, is also connected to each of the N semiconductor switches 50, 50, . . . , 50. The cathode of the diode 51 is connected to the drain of the corresponding semiconductor switch 50, and its anode is connected to the source of the semiconductor switch 50.

The drain of each of the M semiconductor switches 40, 40, . . . , 40 is connected to the drain of the semiconductor switch 20, and their source is connected to the source of the semiconductor switch 20. Likewise, for each of the N semiconductor switches 50, 50, . . . , 50, the drain is connected to the drain of the semiconductor switch 30, and the source is connected to the source of the semiconductor switch 30.

As described thus far, each of the M semiconductor switches 40, 40, . . . , 40 is connected in parallel with the semiconductor switch 20, and each of the N semiconductor switches 50, 50, . . . , 50 is connected in parallel with the semiconductor switch 30.

Each of the M semiconductor switches 40, 40, . . . , 40 and the N semiconductor switches 50, 50, . . . , 50 functions as a second semiconductor switch.

The gates of the M semiconductor switches 40, 40, . . . , 40 and the N semiconductor switches 50, 50, . . . , 50 are separately connected to the control portion 15.

A current can flow between the drain and the source of each of the semiconductor switches 40 and 50, if the voltage applied from the control portion 15 to its gate is greater than or equal to a predetermined voltage. No current will flow between the drain and the source if the voltage applied from the control portion 15 to the gate is less than the predetermined voltage.

Accordingly, each of the semiconductor switches 40 and 50 is on if the voltage applied to the gate is greater than or equal to the predetermined voltage, and is off if the voltage applied to the gate is less than the predetermined voltage.

The control portion 15 adjusts the voltage applied to the gate of each of the M semiconductor switches 40, 40, . . . , 40 and the N semiconductor switches 50, 50, . . . , 50, thereby turning them on and off.

When substantially simultaneously turning on or off the semiconductor switches 20 and 30, the control portion 15 also substantially simultaneously turns on or off the M semiconductor switches 40, 40, . . . , 40 and the N semiconductor switches 50, 50, . . . , 50. In other words, the control portion 15 simultaneously or substantially simultaneously turns on or off the semiconductor switches 20 and 30, the M semiconductor switches 40, 40, . . . , 40, and the N semiconductor switches 50, 50, . . . , 50.

Accordingly, turning on the two semiconductor switches 20 and 30 in Embodiment 1 corresponds to turning on the semiconductor switches 20 and 30, the M semiconductor switches 40, 40, . . . , 40, and the N semiconductor switches 50, 50, . . . , 50 in Embodiment 3. Furthermore, turning off the two semiconductor switches 20 and 30 in Embodiment 1 corresponds to turning off the semiconductor switches 20 and 30, the M semiconductor switches 40, 40, . . . , 40, and the N semiconductor switches 50, 50, . . . , 50 in Embodiment 3.

In Embodiment 3, the control portion 15 turns on or off the two semiconductor switches 20 and 30 in the same manner as in Embodiment 1. The generator 10, the first power storage element 11, the DCDC converter 12, the second power storage element 13, the load 14, and the current sensor 16 function in the same manner as in Embodiment 1.

When the engine is being activated, normally, the control portion 15 adjusts the output voltage of the generator 10 to the normal voltage, and causes the DCDC converter 12 to perform the transformation. Furthermore, the control portion 15 turns off each of the two semiconductor switches 20 and 30, the M semiconductor switches 40, 40, . . . , 40, and the N semiconductor switches 50, 50, . . . , 50. In this case, the power supply system 4 is in the normal state, and the normal state of the power supply system 4 corresponds to the normal state of the power supply system 1.

If it is determined that the output current of the DCDC converter 12 is greater than or equal to the upper limit current when the power supply system 4 is in the normal state, the control portion 15 lowers the output voltage of the generator 10 from the normal voltage to the temporary voltage to cause the DCDC converter 12 to stop the transformation. Furthermore, the control portion simultaneously or substantially simultaneously turns on the two semiconductor switches 20 and 30, the M semiconductor switches 40, 40, . . . , 40, and the N semiconductor switches 50, 50, . . . , 50. In this case, the power supply system 4 is in the direct powering state, and the direct powering state of the power supply system 4 corresponds to the direct powering state of the power supply system 1.

In each of the cases where the power supply system 4 is in the normal state and where the power supply system 4 is in the direct powering state, the control portion 15 performs the same processing as that performed in Embodiment 1. Embodiment 3 differs from Embodiment 1 in that not only the semiconductor switches 20 and 30, but also the M semiconductor switches 40, 40, . . . , 40 and the N semiconductor switches 50, 50, . . . , 50 are simultaneously or substantially simultaneously turned on or off in the processing performed by the control portion 15.

When the engine is deactivated, the generator 10 will not generate power. When the engine is deactivated, the control portion 15 causes the DCDC converter 12 stop the transformation and turns off the two semiconductor switches 20 and 30, the M semiconductor switches 40, 40, . . . , 40, and the N semiconductor switches 50, 50, . . . , 50. Accordingly, when the engine is deactivated, the load 14 is powered by the second power storage element 13, and will not be powered by the generator 10 and the first power storage element 11.

In the power supply system 4, the respective anodes of the diodes 21, 41, 41, . . . , 41 are connected to the respective anodes of the diodes 31, 51, 51, . . . , 51. Accordingly, when the two semiconductor switches 20 and 30, the M semiconductor switches 40, 40, . . . , 40, and the N semiconductor switches 50, 50, . . . , 50 are off, no current will flow between the drains of the semiconductor switches 20 and 30.

The voltage (Vn+ΔVn) is a maximum value of the voltage at the drain of each of the semiconductor switch 20, and the M semiconductor switches 40, 40, . . . , 40. Accordingly, the breakdown voltage between the drain and the source of the M semiconductor switches 40, 40, . . . , 40 should be greater than or equal to (Vn+ΔVn).

The breakdown voltage between the drain and the source of each of the M semiconductor switches 40, 40, . . . , 40 is the same or substantially the same as the breakdown voltage between the drain and the source of the semiconductor switch 20 connected in parallel with each of the M semiconductor switches 40, 40, . . . , 40.

The voltage (Vc+ΔVc) is a maximum value of the voltage at the drain of each of the semiconductor switch 30, and the N semiconductor switches 50, 50, . . . , 50. Accordingly, the breakdown voltage between the drain and the source of the N semiconductor switches 50, 50, . . . , 50 should be greater than or equal to (Vc+ΔVc).

The breakdown voltage between the drain and the source of each of the N semiconductor switches 50, 50, . . . , 50 is the same or substantially the same as the breakdown voltage between the drain and the source of the semiconductor switch 20 connected in parallel with each of the N semiconductor switches 50, 50, . . . , 50.

In Embodiment 3, the control portion 15, the two semiconductor switches 20 and 30, the M semiconductor switches 40, 40, . . . , 40, and the N semiconductor switches 50, 50, . . . , 50 function as a current control device. In this current control device as well, the breakdown voltage between the drain and the source differs between the two semiconductor switches 20 and 30. Therefore, the current control device of Embodiment 3 also achieves the same effect as that achieved in Embodiment 1.

The combined resistance of the on resistances of the semiconductor switch 20, and the M semiconductor switches 40, 40, . . . , 40 is smaller than the on resistance of the semiconductor switch 20. Furthermore, the combined resistance of the on resistances of the semiconductor switch 30, and the N semiconductor switches 50, 50, . . . , 50 is smaller than the on resistance of the semiconductor switch 30. Therefore, when the two semiconductor switches 20 and 30, the M semiconductor switches 40, 40, . . . , 40, and the N semiconductor switches 50, 50, . . . , 50 are on, the resistance between the drains of the two semiconductor switches 20 and 30 is smaller than the resistance between the drains of the two semiconductor switches 20 and 30 of Embodiment 1. Accordingly, the amount of heat generated in the current control device of Embodiment 3 is smaller than the amount of heat generated in the current control device of Embodiment 1.

As described previously, for a semiconductor switch, the on resistance increases with an increase in the breakdown voltage between the drain and the source. Accordingly, the on resistance of each of the semiconductor switch 20 and the M semiconductor switches 40, 40, . . . , 40 is greater than the on resistance of each of the semiconductor switch 30 and the N semiconductor switches 50, 50, . . . , 50.

Therefore, for the resistance between the drains of the semiconductor switches 20 and 30, the amount of decrease in resistance as a result of connecting the semiconductor switch 40 in parallel to the semiconductor switch 20 is greater than the amount of decrease in resistance as a result of connecting the semiconductor switch 50 in parallel to the semiconductor switch 30.

For example, if the on resistance of each of the semiconductor switches 20 and 40 is 10 ohms, the combined resistance of the on resistances of the semiconductor switches 20 and 40 is 5 ohms. Accordingly, the resistance between the drains of the semiconductor switches 20 and 30 is lowered by 5 ohms by connecting a semiconductor switch 40 in parallel to the semiconductor switch 20.

For example, if the on resistance of each of the semiconductor switches 30 and 50 is 6 ohms, the combined resistance of the on resistances of the semiconductor switches 30 and 50 is 3 ohms. Accordingly, the resistance between the drains of the semiconductor switches 20 and 30 is lowered by 3 ohms by connecting a semiconductor switch 50 in parallel to the semiconductor switch 30.

As described previously, a semiconductor switch having a low breakdown voltage between the drain and the source is generally inexpensive.

The number M of the semiconductor switches 40 connected in parallel with the semiconductor switch 20 is different from the number N of the semiconductor switches 50 connected in parallel with the semiconductor switch 30.

From the foregoing, if M is greater than N, it is possible to achieve a current control device in which the resistance between the respective other ends of the two semiconductor switches 20 and 30 when the two semiconductor switches 20 and 30, the M semiconductor switches 40, 40, . . . , 40, and the N semiconductor switches 50, 50, . . . , 50 are on is significantly smaller than that in the current control device of Embodiment 1.

If N is greater than M, it is possible to inexpensively achieve a current control device in which the resistance between the respective other ends of the two semiconductor switches 20 and 30 when the two semiconductor switches 20 and 30, the M semiconductor switches 40, 40, . . . , 40, and the N semiconductor switches 50, 50, . . . , 50 is smaller than that in the current control device of Embodiment 1.

Note that in Embodiment 3, the number M of the semiconductor switches 40 connected in parallel with the semiconductor switch 20 may be the same as the number N of the semiconductor switches 50 connected in parallel with the semiconductor switch 30. In this case as well, it is possible to achieve a current control device in which the resistance between the respective other ends of the two semiconductor switches 20 and 30 when the two semiconductor switches 20 and 30, the M semiconductor switches 40, 40, . . . , 40, and the N semiconductor switches 50, 50, . . . , 50 are on is smaller than that in the current control device of Embodiment 1.

Embodiment 4

In Embodiment 3, the source of the semiconductor switch 20 is connected to the source of the semiconductor switch 30. However, the drain of the semiconductor switch 20 may be connected to the drain of the semiconductor switch 30.

In the following, aspects in which Embodiment 4 differs from Embodiment 1 will be described. Structures other than the structures described below are the same as those of Embodiment 1, and thus are denoted by the same reference numerals, with a detailed description thereof being omitted.

Figure 5:
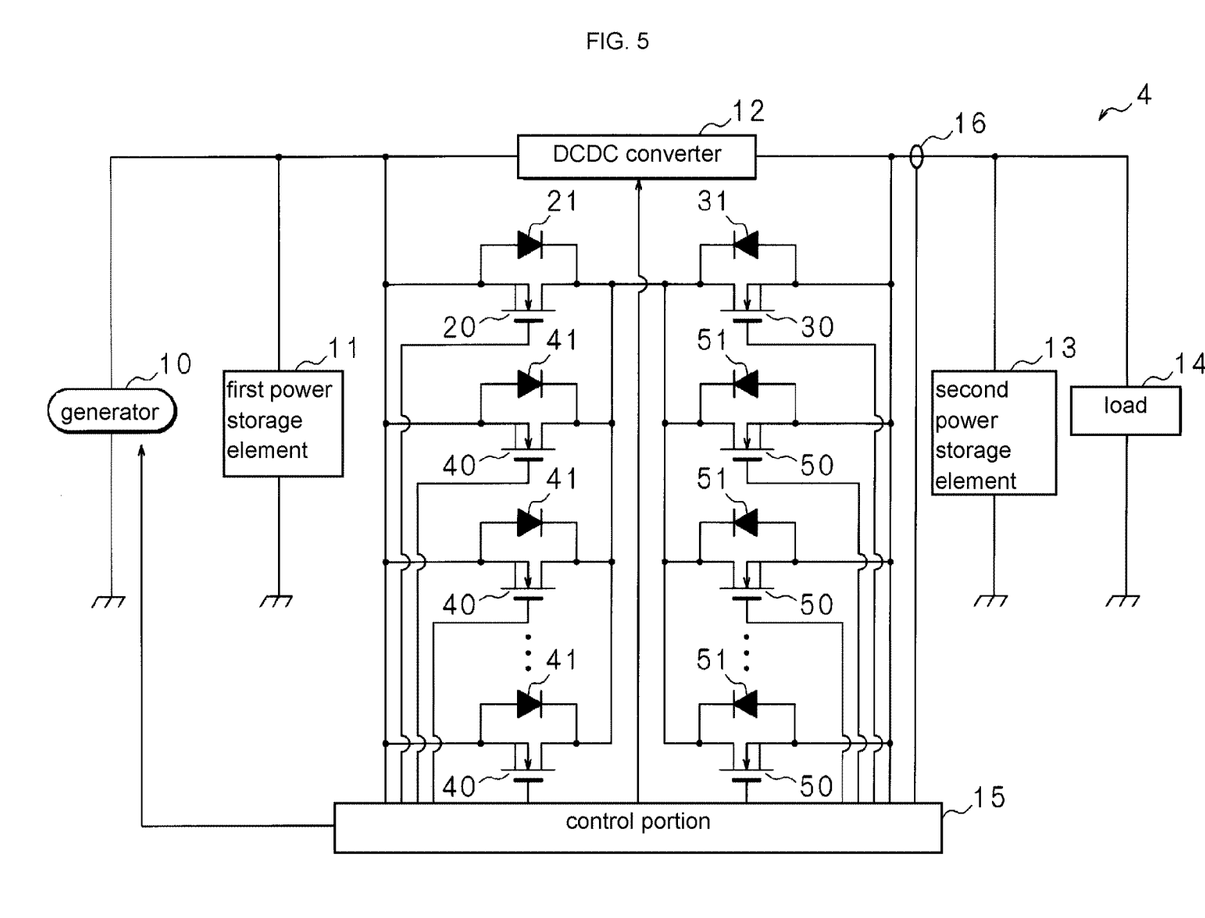
FIG. 5 is a block diagram showing the configuration of a relevant portion of a power supply system according to Embodiment 4.

FIG. 5 is a block diagram showing the configuration of a relevant portion of a power supply system 4 according to Embodiment 4. The power supply system 4 of Embodiment 4 is also suitably installed in a vehicle, like the power supply system of Embodiment 3. The power supply system 4 of Embodiment 4 includes all the constituting elements are included in the power supply system 4 of Embodiment 3. In Embodiment 4, each of the generator 10, the first power storage element 11, the DCDC converter 12, the second power storage element 13, the load 14, the control portion 15, and the current sensor 16 is connected in the same manner as in Embodiment 3.

The drain of the semiconductor switch 20 is connected to the drain of the semiconductor switch 30. One end of each of the generator 10 and the DCDC converter 12, and the positive electrode of the first power storage element 11 are connected to the source of the semiconductor switch 20. The other end of the DCDC converter 12, the positive electrode of the second power storage element 13, and one end of the load 14 are connected to the source of the semiconductor switch 30. In this manner, the two semiconductor switches 20 and 30 connect the respective positive electrodes of the first power storage element 11 and the second power storage element 13. The gates of the semiconductor switches 20 and 30 are separately connected to the control portion 15.

The drain and the source of each of the M semiconductor switches 40, 40, . . . , 40 are connected to the drain and the source, respectively, of the semiconductor switch 20. The drain and the source of each of the N semiconductor switches 50, 50, . . . , 50 are connected to the drain and the source, respectively, of the semiconductor switch 30. The gates of the M semiconductor switches 40, 40, . . . , 40 and the N semiconductor switches 50, 50, . . . , 50 are separately connected to the control portion 15.

The cathode and the anode of the diode 21 are connected to the drain and the source, respectively, of the semiconductor switch 20. Each of the connection relationship between the diode 31 and the semiconductor switch 30, the connection relationship between the diode 41 and the semiconductor switch 40, and the connection relationship between the diode 51 and the semiconductor switch 50 is the same as the connection relationship between the diode 21 and the semiconductor switch 20.

Accordingly, the cathodes of the diodes 21, 41, 41, . . . , 41 are connected to the cathodes of the diodes 31, 51, 51, . . . , 51, respectively. Therefore, when the two semiconductor switches 20 and 30, the M semiconductor switches 40, 40, . . . , 40, and the N semiconductor switches 50, 50, . . . , 50 are off, no current will flow between the sources of the semiconductor switches 20 and 30.

The generator 10, the first power storage element 11, the DCDC converter 12, the second power storage element 13, the load 14, the control portion 15, and the current sensor 16 function in the same manner as in Embodiment 3. As for these functions, the drain and the source of the semiconductor switch 20 are interchanged, the drain and the source of the semiconductor switch 30 are interchanged, the drain and the source of the semiconductor switch 40 are interchanged, and the drain and the source of the semiconductor switch 50 are interchanged in the description of Embodiment 3.

This can explain the function of each of the generator 10, the first power storage element 11, the second power storage element 13, the load 14, the DCDC converter 12, the control portion 15, and the current sensor 16.

Turning on and off of the two semiconductor switches 20 and 30, the M semiconductor switches 40, 40, . . . , 40, and the N semiconductor switches 50, 50, . . . , 50 is performed by the control portion 15 in the same manner as in Embodiment 3.

For the same reason as in Embodiment 2, the breakdown voltage between the drain and the source of the semiconductor switch 30 should be greater than or equal to (Vn+ΔVn), and the breakdown voltage between the drain and the source of the semiconductor switch 20 should be greater than or equal to (Vc+ΔVc). Accordingly, the power supply system 4 of Embodiment 4 uses, as the semiconductor switch 20, a semiconductor switch in which the breakdown voltage between the drain and the source is lower than the breakdown voltage between the drain and the source of the semiconductor switch 30.

As in Embodiment 3, the breakdown voltage between the drain and the source of each of the M semiconductor switches 40, 40, ..., 40 is the same or substantially the same as the breakdown voltage between the drain and the source of the semiconductor switch 20. Furthermore, the breakdown voltage between the drain and the source of each of the N semiconductor switches 50, 50, ..., 50 is the same or substantially the same as the breakdown voltage between the drain and the source of the semiconductor switch 20.

In Embodiment 4 as well, the control portion 15, the two semiconductor switches 20 and 30, the M semiconductor switches 40, 40, ..., 40, and the N semiconductor switches 50, 50, ..., 50 function as a current control device. This current control device has the same features as those of Embodiment 3.

That is, in the current control device of Embodiment 4, the breakdown voltages between the drains and the sources of the two semiconductor switches 20 and 30 are different from each other. Furthermore, each of the M semiconductor switches 40, 40, ..., 40 is connected in parallel with the semiconductor switch 20, and each of the N semiconductor switches 50, 50, ..., 50 is connected in parallel with the semiconductor switch 30. Also, the number M of the semiconductor switches 40 is different from the number N of the semiconductor switches 50. Accordingly, the current control device of Embodiment 4 achieves the same effect as that achieved by the current control device of Embodiment 3.

However, in Embodiment 4, the breakdown voltage between the drain and the source of the semiconductor switch 20 is lower than the breakdown voltage between the drain and the source of the semiconductor switch 30. Accordingly, for the resistance between the sources of the semiconductor switches 20 and 30, the amount of decrease in resistance as a result of connecting the semiconductor switch 50 in parallel to the semiconductor switch 30 is greater than the amount of decrease in resistance as a result of connecting the semiconductor switch 40 in parallel to the semiconductor switch 20.

Therefore, if M is greater than N, the current control device of Embodiment 4 achieves the same effect that achieved by the current control device of Embodiment 3 if N is greater than M. Then, if N is greater than M, the current control device of Embodiment 4 achieves the same effect as that achieved by the current control device of Embodiment 3 if M is greater than N.

Note that in Embodiment 4, the number M of the semiconductor switches 40 connected in parallel with the semiconductor switch 20 may be the same as the number N of the semiconductor switches 50 connected to in parallel to the semiconductor switch 30. In this case as well, it is possible to achieve a current control device in which the resistance between the respective other ends of the two semiconductor switches 20 and 30 when the two semiconductor switches 20 and 30, the M semiconductor switches 40, 40, ..., 40, and the N semiconductor switches 50, 50, ..., 50 are on is smaller than that in the current control device of Embodiment 2.

In Embodiments 1 to 4, each of the semiconductor switches 20, 30, 40, and 50 is not limited to an N-channel FET, and may be a P-channel FET. In this case, the control portion 15 turns on the semiconductor switches 20, 30, 40, and 50 by adjusting the voltage applied to the gate to be less than a predetermined voltage, and turns off the semiconductor switches 20, 30, 40, and 50 by adjusting the voltage applied to the gate to be greater than or equal to the predetermined voltage.

When the semiconductor switch 20 is a P-channel FET, the cathode of the diode 21 is connected to the source of the semiconductor switch 20, and the anode of the diode 21 is connected to the drain of the semiconductor switch 20. Each of the connection relationship between the semiconductor switch 30 and the diode 31, the connection relationship between the semiconductor switch 40 and the diode 41, and the connection relationship between the semiconductor switch 50 and the diode 51 is the same as the connection relationship between the semiconductor switch 20 and the diode 21.

Accordingly, in Embodiments 1 to 4, the breakdown voltage between the drain and the source of the semiconductor switches 20 and 40 when the semiconductor switches 20, 30, 40, and 50 are P-channel FETs is the breakdown voltage between the drain and the source of the semiconductor switches 30 and 50 when the semiconductor switches 20, 30, 40, and 50 are N-channel FETs. The breakdown voltage between the drain and the source of the semiconductor switches 30 and 50 when the semiconductor switches 20, 30, 40, and 50 are P-channel FETs is the breakdown voltage between the drain and the source of the semiconductor switches 20 and 40 when the semiconductor switches 20, 30, 40, and 50 are N-channel FETs.

Therefore, in Embodiments 3 and 4, the effect achieved by the current control device if M is greater than N when the semiconductor switches 20, 30, 40, and 50 are P-channel FETs is the effect achieved by the current control device if N is greater than M when the semiconductor switches 20, 30, 40, and 50 are N-channel FETs. Furthermore, the effect achieved by the current control device if N is greater than M when the semiconductor switches 20, 30, 40, and 50 are P-channel FETs is the effect achieved by the current control device is the effect achieved if M is greater than N when the semiconductor switches 20, 30, 40, and 50 are N-channel FETs.

In Embodiments 3 and 4, the number M of the semiconductor switches 40 or the number N of the semiconductor switches 50 may be zero. Even when the number M of the semiconductor switches 40 is zero, the resistance between the drains of the semiconductor switches 20 and 30 is small since the N semiconductor switches 50 are connected in parallel with the semiconductor switch 30. Likewise, even when the number N of the semiconductor switches 50 is zero, the resistance between the drains of the semiconductor switches 20 and 30 is small since the M semiconductor switches 40 are connected in parallel with the semiconductor switch 20.

Furthermore, in Embodiments 1 to 4, the configuration of the DCDC converter 12 is not limited to the configuration in which the voltage applied to one end is lowered, and may be a configuration in which the voltage applied to one end is raised. In this case, the normal voltage is lower than the transformed voltage.

Embodiments 1 to 4 disclosed herein are to be construed in all aspects as illustrative and not limiting. The scope of the present invention is defined by the claims, rather than the above description, and is intended to include all modifications which fall within the scope of the claims and the meaning and scope of equivalents thereof.

The invention claimed is:

1. A current control device comprising
a switch control portion that substantially simultaneously turns on or off two semiconductor switches whose one ends are connected to each other, a current flowing between other ends of the two semiconductor switches being controlled by the switch control portion turning on or off the two semiconductor switches, wherein respective breakdown voltages across the two semiconductor switches are different from each other, and one or more second semiconductor switches connected in parallel with one of the two semiconductor switches, wherein each of the one or more second semiconductor switches has substantially the same breakdown voltage as the semiconductor switch with which the second semiconductor switch is connected in parallel, and the switch control portion substantially simultaneously turns on or off the two semiconductor switches and the one or more second semiconductor switches, the number of the second semiconductor switches connected in parallel with one of the two semiconductor switches is different from the number of the second semiconductor switches connected in parallel with the other semiconductor switch; and the two semiconductor switches connect respective one ends of two power storage elements to each other.

2. A power supply system comprising:

the current control device according to claim 1;

the two power storage elements; and a load that is powered by the two power storage elements, wherein voltages that are different from each other are applied to the two power storage elements.

* * * * *